(12) United States Patent
Li et al.

(10) Patent No.: US 8,456,842 B2
(45) Date of Patent: Jun. 4, 2013

(54) ELECTRONIC DEVICE

(75) Inventors: Min-Li Li, Shenzhen (CN); Xiao-Hui Zhou, Shenzhen (CN); Ting-Ting Zhao, Shenzhen (CN); Hong Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 294 days.

(21) Appl. No.: 12/979,300

(22) Filed: Dec. 27, 2010

(65) Prior Publication Data
US 2012/0155031 A1 Jun. 21, 2012

(30) Foreign Application Priority Data
Dec. 15, 2010 (CN) .......................... 2010 1 0589287

(51) Int. Cl.
*H05K 7/20* (2006.01)
(52) U.S. Cl.
USPC ........................... 361/707; 361/704; 361/719

(58) Field of Classification Search
None
See application file for complete search history.

(56) References Cited

U.S. PATENT DOCUMENTS

| | | | | |
|---|---|---|---|---|
| 6,687,127 B2 * | 2/2004 | Takami | ......................... | 361/719 |
| 7,164,586 B2 * | 1/2007 | Lin | ............................... | 361/714 |
| 7,345,883 B2 * | 3/2008 | Wakabayashi et al. | ....... | 361/714 |
| 7,623,349 B2 * | 11/2009 | Refai-Ahmed et al. | ...... | 361/719 |
| 7,663,883 B2 * | 2/2010 | Shirakami et al. | ............ | 361/700 |

* cited by examiner

*Primary Examiner* — Boris Chervinsky
(74) *Attorney, Agent, or Firm* — Altis Law Group, Inc.

(57) ABSTRACT

An exemplary electronic device includes a shell, a mother board and a metal sheet disposed at an inner side of the shell, an electronic apparatus fixed on the mother board, and a heat conducting plate thermally connecting the electronic apparatus with the metal sheet. The metal sheet is located between the shell and the mother board to shield electro magnetic interference from the electronic apparatus. The electronic apparatus generates heat when working. The electronic apparatus is located between the mother board and the metal sheet, and is spaced from the metal sheet.

19 Claims, 4 Drawing Sheets

ELECTRONIC DEVICE

BACKGROUND

1. Technical Field

The disclosure relates to electronic devices, and particularly to an electronic device facilitating heat dissipation and providing electromagnetic interference shielding.

2. Description of Related Art

Nowadays, with the development of electronics technology, consumer electronic devices, such as a DVD (Digital Video Disc) players, are devised to be much thinner and smaller than before. Yet such electronic devices are able to hold many more electronic modules than before, and so are able to perform many more functions than previously. Some of the electronic modules may generate electromagnetic radiation during operation, and such radiation is liable to cause EMI (Electromagnetic Interference) in other electronic devices. In addition, an interior space of the electronic device is very limited, and the electronic modules occupy much of that space. This can result in heat generated by the electronic modules accumulating rather than being dissipated in a timely manner.

What is needed, therefore, is an electronic device which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
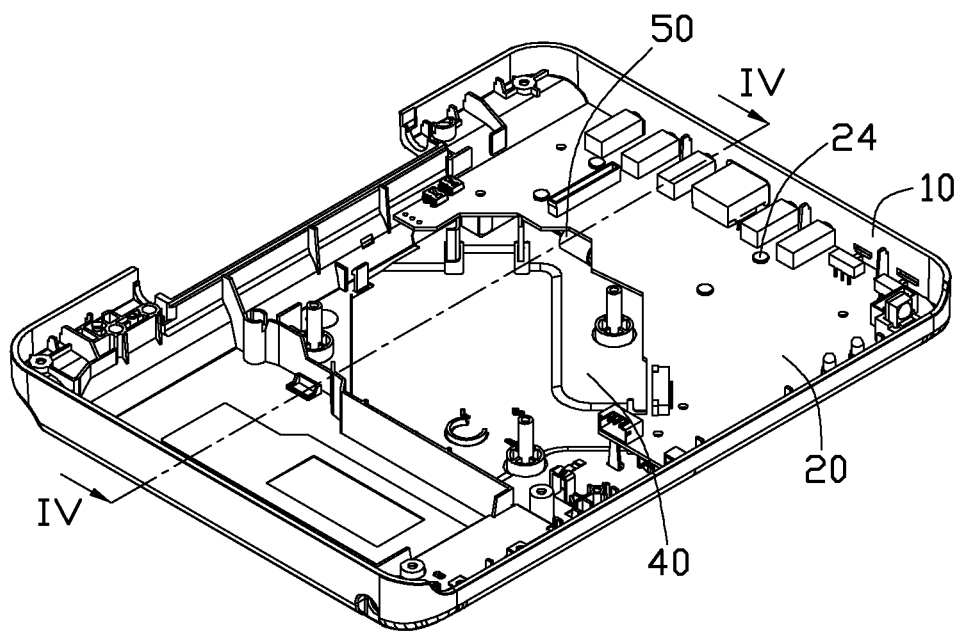
FIG. 1 is an isometric, assembled view of an electronic device in accordance with one embodiment of the disclosure.
Figure 2:
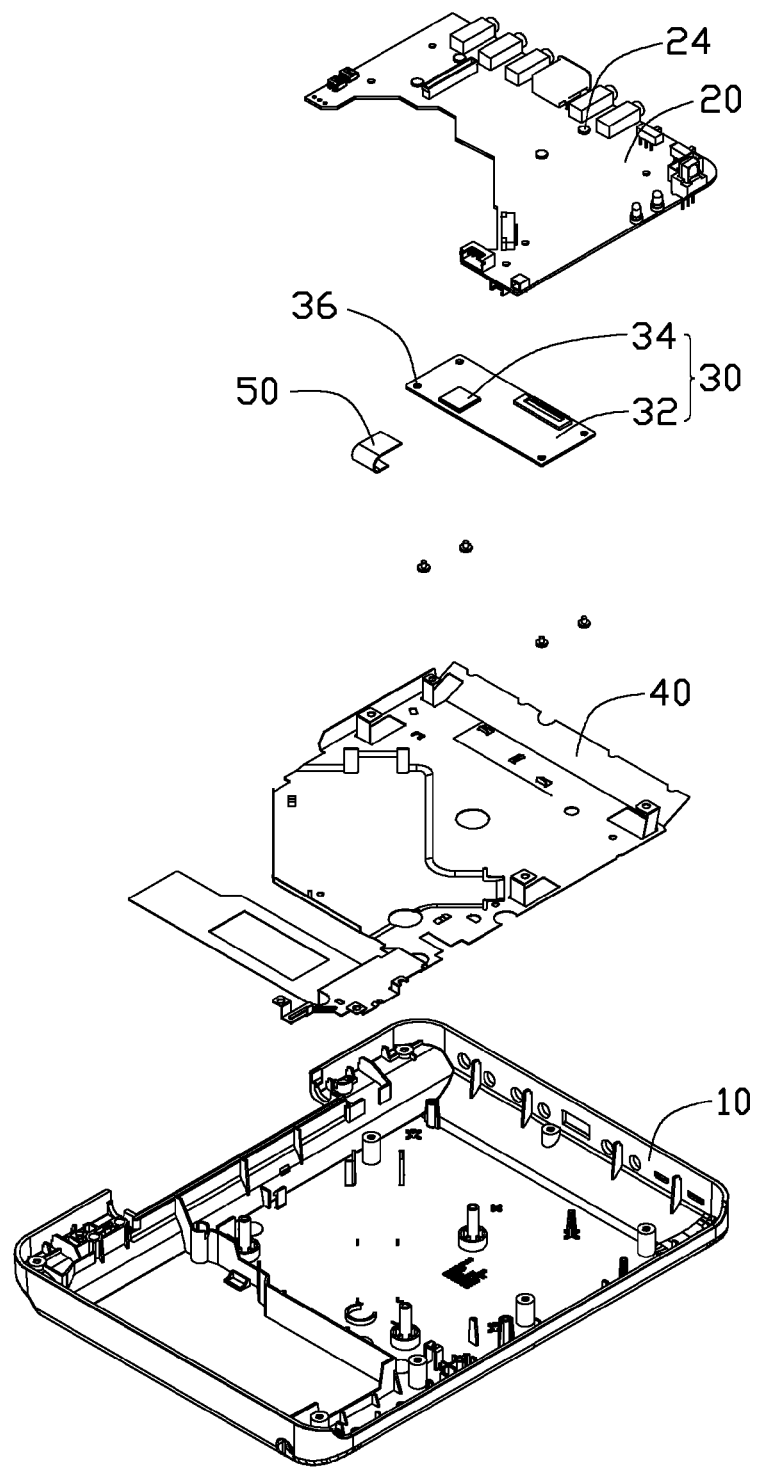
FIG. 2 is an isometric, exploded view of the electronic device of FIG. 1.

Referring to FIGS. 1 and 2, an electronic device in accordance with an embodiment of the disclosure is shown. The electronic device can be a DVD player. The electronic device includes a shell 10, a mother board 20 and a metal sheet 40 both disposed at an inner side of the shell 10, a function module 30 fixed on the mother board 20, and a heat conducting plate 50 thermally connecting the function module 30 with the metal sheet 40.

Figure 3:
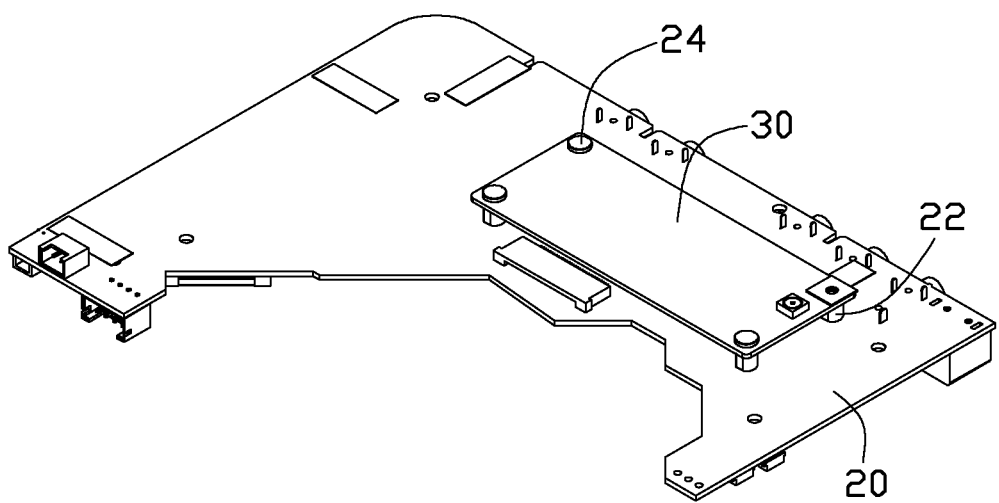
FIG. 3 is an isometric view of a motherboard and a function module of the electronic device of FIG. 1, showing the motherboard and function module inverted.

Also referring to FIG. 3, the function module 30 is fixed on a bottom of the mother board 20 via four sleeves 22. The mother board 20 defines four fixing holes (not labeled). A top end of each sleeve 22 abuts a bottom face of the mother board 20, and is aligned with a corresponding fixing hole of the mother board 20. Four fasteners 24 (such as screws) extend through the fixing holes of the mother board 20 to engage into the top ends of the sleeves 22, thereby fixing the sleeves 22 on the bottom of the mother board 20.

In this embodiment, the function module 30 is an electronic apparatus such as a tuner circuit module. The function module 30 includes a circuit board 32, and an electronic component 34 disposed on a top face of the circuit board 32. The electronic component 34 generates a large amount of heat and electromagnetic (EM) waves during operation. The circuit board 32 defines four through holes 36 corresponding to the four sleeves 22. Another four fasteners 24 extend through the through holes 36 of the circuit board 32 to engage into bottom ends of the sleeves 22, to thereby fasten the circuit board 32 on the bottom ends of the sleeves 22. The circuit board 32 and the electronic component 34 are spaced from the mother board 20 because the sleeves 22 are disposed therebetween the circuit board 32 and the electronic component 34.

In this embodiment, the metal sheet 40 can be an iron sheet. The metal sheet 40 is spaced from an inner face of the shell 10 and the function module 30. The metal sheet 40 has a larger area than, and can completely cover, the function module 30. Thereby, the metal sheet 40 shields the electronic component 34, and prevents EM waves of the electronic component 34 from transmitting out of the shell 10.

Figure 4:
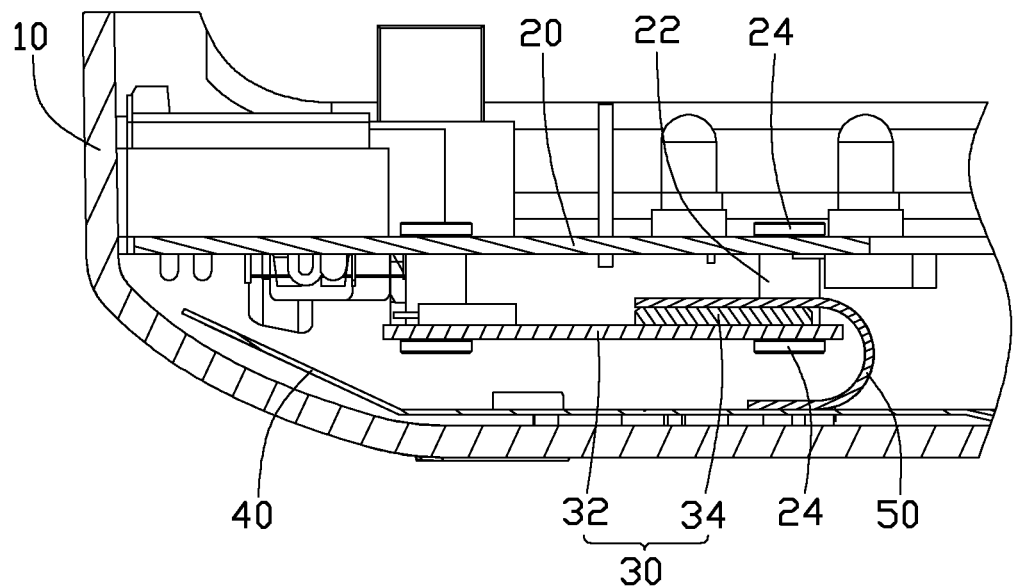
FIG. 4 is a cross-sectional view of part of the electronic device of FIG. 1, taken along line IV-IV thereof.

Also referring to FIG. 4, the heat conducting plate 50 can be made of metal such as aluminum, copper or an alloy thereof, and is substantially J-shaped. An inner face at one end of the heat conducting plate 50 faces the metal sheet 40 and thermally contacts the electronic component 34. An outer face at the other end of the heat conducting plate 50 thermally contacts a top face of the metal sheet 40. The heat conducting plate 50 completely covers the electronic component 34, and EM waves from the electronic component 34 can be blocked from transmitting upwardly.

In summary, the electronic component 34 thermally connects the metal sheet 40 via the heat conducting plate 50. The metal sheet 40 not only can shield the electronic component 34 to prevent EMI, but also can dissipate heat from the electronic component 34 in a timely manner.

It is believed that the embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An electronic device comprising:
a shell;
a mother board and a metal sheet disposed at an inner side of the shell, the metal sheet being located between the shell and the mother board;
an electronic apparatus fixed on the mother board, the electronic apparatus being of a kind that generates EM waves and heat during operation, the electronic apparatus being located between the mother board and the metal sheet, and spaced from the metal sheet, the electronic apparatus comprising a circuit board and an electronic component disposed on the circuit board, the electronic component being spaced from the mother board;
a heat conducting plate thermally connecting the electronic apparatus with the metal sheet; and
a sleeve fixed between the circuit board and the mother board.

2. The electronic device of claim 1, wherein the heat conducting plate is substantially U-shaped, one end of the heat conducting plate thermally contacting the electronic apparatus, the other end of the heat conducting plate thermally contacting the metal sheet.

3. The electronic device of claim 1, wherein the heat conducting plate is made of metal.

4. The electronic device of claim 1, wherein the heat conducting plate is substantially U-shaped, one end of the heat conducting plate thermally contacting the electronic component of the electronic apparatus, the other end of the heat conducting plate thermally contacting the metal sheet.

5. The electronic device of claim 4, wherein the mother board defines a fixing hole, one end of the sleeve abutting the mother board and being aligned with the fixing hole of the mother board, a fastener extending through the fixing hole of the mother board to fasten the sleeve on the mother board.

6. The electronic device of claim 5, wherein the circuit board of the electronic apparatus defines a through hole, another fastener extending through the through hole of the circuit board to fasten the circuit board on the other end of the sleeve.

7. The electronic device of claim 4, wherein the heat conducting plate completely covers the electronic component of the electronic apparatus.

8. The electronic device of claim 7, wherein a face of the heat conducting plate contacting the electronic component faces the metal sheet.

9. The electronic device of claim 4, wherein a face of the heat conducting plate contacting the electronic component faces the metal sheet.

10. The electronic device of claim 1, wherein the mother board defines a fixing hole, one end of the sleeve abutting the mother board and being aligned with the fixing hole of the mother board, a fastener extending through the fixing hole of the mother board to fasten the sleeve on the mother board.

11. The electronic device of claim 10, wherein the circuit board of the electronic apparatus defines a through hole, another fastener extending through the through hole of the circuit board to fasten the circuit board on the other end of the sleeve.

12. The electronic device of claim 1, wherein the circuit board of the electronic apparatus defines a through hole, a fastener extend through the through hole of the circuit board to fasten the circuit board on one end of the sleeve.

13. The electronic device of claim 1, wherein the electronic apparatus is a tuner circuit module.

14. The electronic device of claim 1, wherein the metal sheet is an iron sheet.

15. The electronic device of claim 1, wherein the metal sheet is spaced from the shell.

16. An electronic device comprising:
a shell;
a mother board and a metal sheet disposed at an inner side of the shell, the metal sheet being located between the shell and the mother board;
an electronic apparatus fixed on the mother board, the electronic apparatus being of a kind that generates EM waves and heat during operation, the electronic apparatus being located between the mother board and the metal sheet, and spaced from the metal sheet; and
a heat conducting plate, the heat conducting plate being substantially U-shaped, one end of the heat conducting plate thermally contacting the electronic apparatus, and the other end of the heat conducting plate thermally contacting the metal sheet.

17. The electronic device of claim 16, further comprising a sleeve, wherein the electronic apparatus comprises a circuit board and an electronic component disposed on the circuit board, the sleeve is fixed between the circuit board and the mother board, the electronic component is spaced from the mother board, and the heat conducting plate thermally contacts the electronic component of the electronic apparatus.

18. The electronic device of claim 17, wherein the heat conducting plate completely covers the electronic component of the electronic apparatus.

19. The electronic device of claim 18, wherein a face of the heat conducting plate contacting the electronic component faces the metal sheet.

* * * * *